United States Patent
Casey et al.

(10) Patent No.: US 7,786,486 B2
(45) Date of Patent: Aug. 31, 2010

(54) DOUBLE-SIDED PACKAGE FOR POWER MODULE

(75) Inventors: Leo Francis Casey, Lexington, MA (US); Bogdan Szczepan Borowy, Billerica, MA (US); Gregg Herbert Davis, Harvard, MA (US); James William Connell, III, Upton, MA (US)

(73) Assignee: Satcon Technology Corporation, Boston, MA (US)

( * ) Notice: Subject to any disclaimer, the term of this patent is extended or adjusted under 35 U.S.C. 154(b) by 86 days.

(21) Appl. No.: 11/497,804

(22) Filed: Aug. 2, 2006

(65) Prior Publication Data

US 2007/0057284 A1    Mar. 15, 2007

Related U.S. Application Data

(60) Provisional application No. 60/705,101, filed on Aug. 2, 2005.

(51) Int. Cl.
*H01L 31/111* (2006.01)

(52) U.S. Cl. .......... 257/76; 257/706; 257/712; 257/E23.11; 257/E23.112

(58) Field of Classification Search .......... 257/706, 257/717, E23.11, E23.112, 76–78
See application file for complete search history.

(56) References Cited

U.S. PATENT DOCUMENTS

| | | | | |
|---|---|---|---|---|
| 5,060,130 A | 10/1991 | Steigerwald | .......... | 363/65 |
| 5,113,337 A | 5/1992 | Steigerwald | .......... | 363/98 |
| 5,119,283 A | 6/1992 | Steigerwald et al. | .......... | 363/37 |
| 5,481,449 A | 1/1996 | Kheraluwala et al. | .......... | 363/17 |
| 5,650,592 A * | 7/1997 | Cheskis et al. | .......... | 174/540 |
| 5,781,421 A | 7/1998 | Steigerwald et al. | .......... | 363/21 |
| 6,166,602 A | 12/2000 | Steigerwald et al. | .......... | 330/251 |
| 6,448,645 B1 * | 9/2002 | Kimura et al. | .......... | 257/735 |
| 6,556,462 B1 | 4/2003 | Steigerwald et al. | .......... | 363/89 |
| 6,583,705 B2 | 6/2003 | Schutten et al. | .......... | 336/229 |
| 7,173,334 B2 * | 2/2007 | Sung | .......... | 257/720 |
| 2003/0036247 A1 * | 2/2003 | Eriksen et al. | .......... | 438/455 |
| 2003/0131476 A1 | 7/2003 | Ocher et al. | | |
| 2004/0134646 A1 * | 7/2004 | Chu et al. | .......... | 165/185 |
| 2004/0169266 A1 * | 9/2004 | Maxwell | .......... | 257/684 |
| 2004/0238944 A1 * | 12/2004 | Bish et al. | .......... | 257/706 |
| 2005/0189647 A1 * | 9/2005 | Sung | .......... | 257/720 |
| 2006/0120047 A1 * | 6/2006 | Inoue | .......... | 361/699 |
| 2006/0170113 A1 * | 8/2006 | Tanaka et al. | .......... | 257/778 |
| 2006/0214306 A1 * | 9/2006 | Yamazaki et al. | .......... | 257/777 |

* cited by examiner

*Primary Examiner*—Evan Pert
*Assistant Examiner*—Krista Soderholm
(74) *Attorney, Agent, or Firm*—Weingarten, Schurgin, Gagnebin & Lebovici LLP

(57) ABSTRACT

An electronic semiconductor package is described. The package has a wide band gap electronic semiconductor device requiring heat removal. On one side of the electronic semiconductor device is a first, thermally-conductive, electrically-insulative substrate having a predetermined electrically-conductive wire pattern affixed thereto. On the other side of the electronic semiconductor device is a second, thermally-conductive, electrically-insulative substrate. A heat removal device is mechanically-coupled to the second substrate. The heat removal device is made of a graphite-metal or metal-matrix composite material and a fin array structure of the same material. The coefficients of thermal expansion of the heat removal device and the first and second substrates are matched to minimize internal and external stresses.

19 Claims, 5 Drawing Sheets

DOUBLE-SIDED PACKAGE FOR POWER MODULE

CROSS REFERENCE TO RELATED APPLICATIONS

This application claims the benefit of U.S. provisional patent application No. 60/705,101 filed on Aug. 2, 2005.

STATEMENT REGARDING FEDERALLY SPONSORED RESEARCH OR DEVELOPMENT (Not Applicable)

BACKGROUND OF THE INVENTION

The present invention relates to power semiconductors and particularly to a highly-reliable package for wide band gap power devices such as silicon carbide (SiC) power device applications and/or combined SiC and silicon power device applications.

Packaging requirements for high switching frequency, high-power device applications require effective heat transfer and removal as well as resistance to stress-related, mechanical or thermal, degradation. Indeed, effective packaging design must strike a delicate balance between these two requirements. Providing greater heat transfer, typically, comes at the expense of increased thermal stress, and vice versa.

Heretofore, to meet these requirements, conventional packaging has included insulated metal substrates, direct-bonded copper packages, ceramic substrates, alumina substrates, and other related heat transfer devices. More recently, the use of carbon nanotubes as bumps for flip-chip application has been proposed.

A conventional insulated-gate bipolar transistor (IGBT) module package is shown in FIG. 5. The module 70 includes at least one semiconductor power device die 72, an electrically-insulating layer 74, a heat-dissipating layer, e.g., a heat spreader 76, and a heat removal device or heat sink 78.

Connecting wires 71, such as copper or aluminum wires, are bonded to input/output pins on the exposed, upper surface of the silicon (Si) power devices 72. An electrically-insulating layer, typically a ceramic such as aluminum oxide ($Al_2O_3$), aluminum nitride (AlN) or berylia 74, is soldered to the lower surface of the Si power device die 72, to isolate the devices 72 electrically.

The under side of the insulating layer 74 is soldered to a copper or aluminum heat spreader 76. Typically, metal layers 73 and 75 are provided on top and under sides of the insulating layer 74 to facilitate mechanically coupling the insulating layer 74 to the Si power device die 72 on its top side and to the heat spreader 76 on its under side.

The heat spreader 76 is thermally-coupled to the heat sink 78. A layer of grease 77 often separates the heat spreader 76 from the heat sink 78. Arrow 79 shows the direction of heat transfer for the prior art device 70.

The increased use of Wide Band Gap semiconductors (WBG), such as silicon carbide (SiC) and gallium nitride (GaN), and the anticipated greater use of diamond, especially in power semiconductor applications, can produce smaller, faster, and cheaper semiconductor power packages. Smaller semiconductor power device offer higher power density, which is advantage. However, smaller packages produce higher operating temperatures (T) and higher thermal loading for the power package.

Although, SiC has a higher coefficient of thermal conductivity than Si—making SiC a better choice for heat transfer purposes—it also has a lower coefficient of thermal expansion (CTE). As a result, in comparison with a Si device, a SiC device can produce a higher gradient of thermal expansion between the substrate and the bonding materials. However, higher gradients of thermal expansion produce higher mechanical and thermal stresses.

Advantageously, when compared to pure Si devices, WBG devices support higher switching frequencies. Higher switching frequencies can reduce the required size of passive components, e.g., capacitors and inductors, and can enhance power quality. However, the disadvantages of faster switching speeds include greater power losses due to parasitic and/or stray inductance and parasitic and/or device capacitance.

A large percentage of all electronic device failures are due either to overheating or to mechanical or electrical stresses within the electronic package. Because WBG devices accommodate elevated operating temperatures and because smaller devices having higher power densities produce more heat per area, reliability due to overheating remains a design concern. At very high operating temperatures, wire bonds can delaminate, causing a degradation of performance. Furthermore, stresses resulting from excessive expansion/contraction caused by thermal cycling of the electronics and, more particularly, stresses resulting from excessive expansion/contraction resulting from a mismatch of material properties, e.g., coefficient of thermal expansion (CTE), between adjacent layers in the module or package also remain a design concern. This is especially true at the interface between ceramic insulators having relatively low thermal conductivity and low CTE and heat sinks or heat spreaders or conductive layers having relatively high thermal conductivity and comparatively high CTEs.

Insulated metal substrates are low-cost packages that exhibit good thermal performance. The CTE mismatches within insulated metal substrates, however, is large. Direct-bonded copper (DBC) substrates provide improved CTE matching and good thermal performance. DBC substrates, however, are more costly than insulated metal substrates. Thus, there continues to be a need for new and better packaging technology to provide better thermal matching and improved electrical conductance at reasonable cost.

Accordingly, it would be desirable to provide a highly-reliable, high-speed, thermal-resistant module package for a power device.

SUMMARY OF THE INVENTION

In accordance with the present invention, a double-sided module package for a high heat flux electronic device such as a power module is disclosed. The double-sided module package includes wide band gap (WBG) technology, combined WBG and silicon (Si) technology, and related material technologies.

The double-sided module package includes at least one electronic semiconductor device; a first layer; a heat removal device; and a second layer. The electronic semiconductor device includes a plurality of electrical contact elements for making electrical contact with the at least one electronic device, which is provided on at least a first side thereof.

The first layer includes a first electrically insulating and thermally conductive substrate and a first predetermined electrically conductive wiring pattern. The first electrically insulating and thermally conductive substrate includes a dielectric material, such as a ceramic, e.g., aluminum nitride, aluminum oxide, alumina or berylia. The first predetermined electrically conductive wiring pattern is disposed on the substrate. The first predetermined electrically conductive wiring pattern is, further, electrically mated to the plurality of electrical contact elements on the second side of the at least one electronic semiconductor device.

The heat removal device or heat sink comprises a thermally-anisotropic metal-carbon matrix comprising carbon in a metal matrix. More specifically, the heat sink includes a graphite-metal or metal-matrix composite portion, to remove heat from the electronic semiconductor device by conduction, and a fin array structure that is thermally coupled to the graphite-metal or metal-matrix composite portion, to remove heat from the graphite-metal or metal-matrix composite portion by convection. The fin array structure includes fins having channels disposed between adjacent fins to accommodate a cooling fluid.

The graphite-metal or metal-matrix composite portion and the fin array structure are made of highly thermally-conductive materials, such as graphite and/or aluminum silicon carbide. More particularly, the graphite-metal or metal-matrix composite portion comprises graphite materials and thermally-anisotropic, integrated dielectric materials. For example, the dielectric material used in manufacturing the second layer can be included in the graphite-metal or metal-matrix composite portion.

The second layer includes a second electrically insulating and thermally conductive substrate. The second electrically insulating and thermally conductive substrate includes a dielectric material, such as a ceramic, e.g., aluminum nitride, aluminum oxide, alumina or berylia. The second electrically insulating and thermally conductive substrate is thermally coupled to the heat removal device on a first side thereof and to the first side of the at least one electronic semiconductor device on a second side thereof. The second layer has a thickness range between about 5 and about 25 mils.

Optionally, the second layer includes a second predetermined electrically conductive wiring pattern that is disposed on the second electrically insulating and thermally conductive substrate. Selected locations of the wiring pattern are electrically mated to selected contacts the first side of the at least one electronic semiconductor device.

Advantageously, the coefficient of thermal expansion of the at least one electronic semiconductor device, the first layer, the second layer and the heat removal device are matched to minimize internal and external stresses resulting from material responses to cyclical temperature changes.

Optionally, a second heat removal device can be thermally-coupled to the first electrically insulating and thermally conductive substrate of the first layer.

BRIEF DESCRIPTION OF THE DRAWINGS

The invention will be better understood by reference to the following more detailed description and accompanying drawings where like reference numbers refer to like parts.

DETAILED DESCRIPTION OF THE INVENTION

U.S. provisional patent application No. 60/705,101 filed on Aug. 2, 2005 and titled "Double Sided Package for Power Module", is incorporated herein by reference in its entirety.

A double-sided module package for high thermal loading electronic semiconductor devices is disclosed. The module package provides improved thermal removal, higher power density, and greater reliability, with reduced parasitic inductance and reduced thermal and mechanical stresses. The advantages of higher power density and improved thermal removal are provided, in part, by using wide band gap (WBG) integrated circuitry, such as silicon carbide (SiC), gallium nitride (GaN), diamond, and similar wide band gap materials, or WBG integrated circuits in combination with pure silicon (Si) integrated circuits. The advantages of greater reliability and reduced stress are provided by improved matching of thermal expansion coefficients (CTE) between adjacent layers of the power module.

Figure 1:
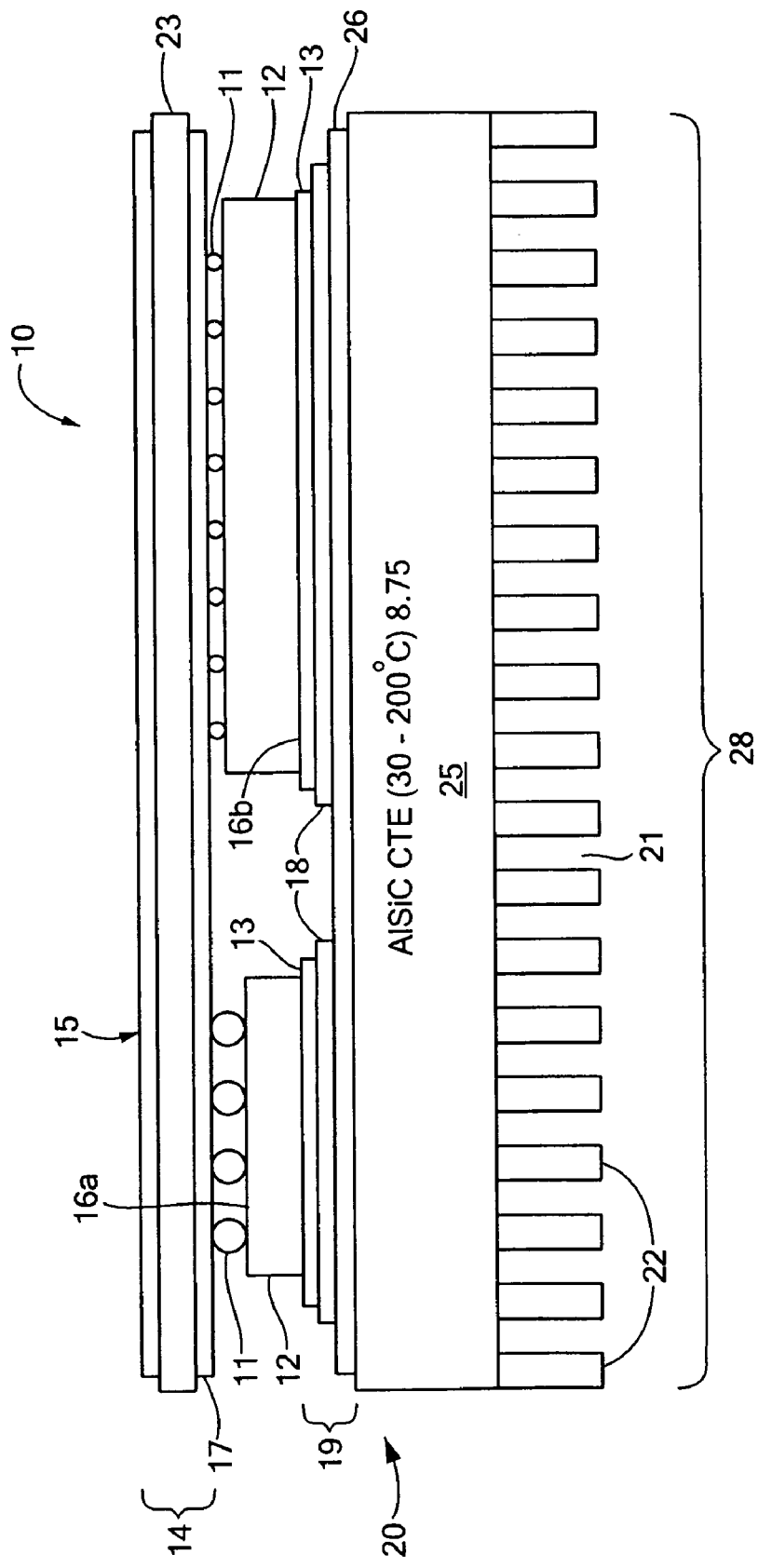
FIG. 1 is a cross-sectional schematic view of a double-sided package in accord with the present invention.

A double-sided module package 10 is shown in FIG. 1. The module package 10 includes one or more solid state, integrated circuits 12, such as a flip-chip-type device, an upper layer 14, a second, electrically-insulating, thermally-conductive substrate 25, and a cold plate assembly (heat removal device) or heat sink 20. For the power module package 10 shown in FIG. 1, the integrated circuits 12 includes at least one electronic semiconductor device, such as the Si Insulated-Gate Bipolar Transistor (IGBT) and SiC diode shown.

"Flip-chip" circuits refer to a surface-mounted integrated circuit 12' that can be mechanically-attached, i.e., bonded or soldered, to a substrate, such as a printed circuit board (PCB) (not shown), electrically conductive wiring pattern, and/or metal contact. Advantageously, a plurality of electrical contact elements, e.g., the input and output pins 11, on the "flip-chip" circuits 12 are attached to wiring patterns on the substrate using, for example, direct chip connections (DCA), rather than using conventional wire bonding connections. As a result, wire bonds are not present.

Spheres, pins, balls, pads or bumps 11 (collectively referred to as "bumps" hereinafter) of a conductive material, e.g., gold, silver, platinum, copper, silicon, amide-imide, epoxies, indium solder alloy, gold-tin solder, and other suitable, conductive, electrical contact materials, are disposed at discrete locations on the lower surface 16a of the integrated circuit 12, e.g., in a ball grid array (BGA). The bumps 11 in the BGA are arrayed to be in registration with selected locations of predetermined electrically conductive wiring patterns that are disposed on an insulative substrate.

Once the integrated circuit 12 is placed in aligned relationship with the insulative substrate, heat sufficient to exceed the melting point of the bump material is applied to the bumps 11, to conductively bond the bumps 11 of the integrated circuit 12 to the wiring pattern.

The bumps 11 electrically-couple each integrated circuit 12 to a first side of an electrically-conductive wiring pattern 17. The electrically-conductive wiring pattern 17 can be relatively thin (about 10 mils thick). Furthermore, the electrically-conductive wiring pattern 17 can be a copper-foil layer that is etched, e.g., photochemical etching, to provide the electric connections and circuit pattern of the electrically-conductive wiring pattern 17.

The second side of the electrically-conductive wiring pattern 17, is affixed to a first, electrically-insulating, thermally-conductive substrate 23. Together, the first, electrically-insulating, thermally-conductive substrate 23 and the electrically-conductive wiring pattern 17 comprise the upper layer 14.

The first, electrically-insulating, thermally-conductive substrate 23 is made of a material that provides both low electrical conductivity and low thermal resistance. In one aspect, the first, electrically-insulating, thermally-conductive substrate 23 can be made of a ceramic material, e.g., aluminum nitride (AlN), aluminum oxide $Al_2O_3$) or "alumina", berylia, and other suitable conductive, electrically-insulating materials. Accordingly, the first, electrically-insulating, thermally-conductive substrate 23 isolates the electrically-conductive wiring pattern 17 from other current-carrying devices 15, while conducting heat generated by the integrated circuits 12 away from the heat-producing elements of the power module 10.

The surface 16b of each integrated circuit 12 is also mechanically-attached, such as by soldering or bonding, to a second, electrically-conductive wiring pattern 18. Eutectic soldering, e.g., using a gold-tin (Au—Sn) solder 13, provides an acceptable CTE match between the integrated circuit 12 and the second, electrically-conductive wiring pattern 18. Matching CTEs of adjacent materials reduces mechanical and electrical stresses therebetween.

The second, electrically-conductive wiring pattern 18 is also relatively thin (about 10 mils thick). The second, electrically-conductive wiring pattern 18 can also be a copper-foil layer that is etched, e.g., photochemical etching, to provide electric connections and circuit pattern of the electrically-conductive wiring pattern 18.

The relatively thin, electrically-conductive wiring pattern 18 is affixed to a second, electrically-insulating, thermally-conductive substrate 26. Together, the electrically-conductive wiring pattern 18 and the second, electrically-insulating, thermally-conductive substrate 26 comprise the second layer 19.

The second, electrically-insulating, thermally-conductive substrate 26 also is made of a material that provides both low electrical conductivity and low thermal resistance. For example, the second, electrically-insulating, thermally-conductive substrate 26 can be made of a ceramic material, e.g., AlN, $Al_2O_3$, berylia, and other suitable electrically-insulating and thermally-conductive materials.

Conventional ceramic, e.g., alumina, aluminum nitride or berylia substrates, range in thickness from about 25 to about 40 mils. These ceramic insulation substrates have, typically, been relatively thick for ease of handling. Furthermore, intrinsic defects in the substrate lower ultimate tensile strength. For example, applications with non-WBG semiconductors, generally, have higher thermal gradients and wider temperature extremes. These attributes exacerbate the intrinsic defects, requiring thicker insulators to maintain robustness. Insulator substrates are also made "thicker" to better absorb thermal expansion and to compensate for high thermal stresses resulting from the use of highly-expansive materials, such as copper, as electrical contacts.

The present invention, however, uses relatively "thin", electrically-insulating, thermally-conductive substrates 23 and 26 having a range of thicknesses generally between about 5 mils and about 25 mils. Thicknesses in the 5-25 mil range allow fuller utilization of the inherent properties of the WBG materials, reducing thermal resistance and stress at interfaces.

The 5 mil-thickness lower boundary also avoids dielectric breakdown at most normal operating voltage levels to which the dielectric is subjected. The 5 mil-thickness lower boundary further ensures that the electrically-insulating, thermally-conductive substrates 23 and 26 can be handled during manufacture without robotic handling. Thinner "thicknesses", which is to say, below about 5 mils are possible with robotic handling. Finally, a 5 mil-thick insulator can withstand thermal stresses that may be induced from variations in CTE.

The second, electrically-insulating, thermally-conductive substrate 26 is mechanically-attached by soldering or brazing or adhesively-attached to the heat sink 20. The heat sink 20 can include a graphite-metal composite or a metal-matrix composite (MMC) substrate 25 and a fin, or comb-like, structure 28.

The MMC substrate 25 is made of a highly thermally-conductive material, e.g., graphite, aluminum silicon carbide (AlSiC), and other suitable materials, and of a material having a CTE range that matches or closely matches the CTE range of the second, electrically-insulating, thermally-conductive substrate 25. The fin array structure 28 is made of the same or a different thermally-conductive material than the MMC substrate 25.

By integrating dielectric materials, such as the dielectric materials used for the second, electrically-insulation, thermally-conductive substrate 25, in the MMC substrate 25 during formation of the single-cast composite, thermal expansion matching between the MMC substrate 25 and the electrically-insulating, thermally-conductive substrate 26 is greatly improved. Improved CTE matching between adjacent layers in the package 10 having different material properties reduces internal and external thermal stresses, which improves the reliability of the module package 10.

Integrating the material comprising the second, electrically-insulating, thermally-conductive substrate 26 during formation of the single-cast composite of the MMC substrate 25 also promotes using thinner layers. Advantageously, stresses due to CTE mismatches at the resulting interfaces of thinner layers are reduced. Thus, when compared to conventional DBC layers, "thinner" insulating substrates, for example, between about 5 and 25 mils, can be used.

Although mention is made that the dielectric material integrated into the MMC substrate 25 can be the same material as that found in the second, electrically-insulating, thermally-conductive substrate 25, the invention is not to be construed or limited thereto. For example, current module packages can provide about 180 W/m-° K of heat dissipation and, further, can only match CTE within about ±8 and 12 parts per million per degree Centigrade (ppm/° C.). In comparison, packages with a graphite-metal or MMC substrate 25 can provide about 800 W/m-° K of heat dissipation and can match CTE within about ±2 or 3 ppm/° C. Parasitic loop inductance, likewise, can be reduced from about 10 nH for a conventional module package to about 2 nH for a module package 10 having a graphite-metal or MMC substrate 25.

The fin array structure 28 includes a plurality of fins 22 with a narrow channel 21 disposed between adjacent fins 22. The width of the channel 21 provides a fluid path through which a fluid, e.g., gas, air, and the like, can circulate to remove heat from the heat sink 20 and the fins 22 by convection.

Although the present invention is not to be construed as being limited thereto, those skilled in the art appreciate that greater heat removal is effected under turbulent flow conditions. Hence, those skilled in the art will appreciate that the width of the channels 21 and the arrangement and length of the fins 22 can be adjusted to provide optimal heat removal, e.g., by maintaining turbulent flow conditions through the fin array structure 28.

An arrangement of a high thermally-conductive MMC 25 and graphite-metal fin array structure 28 provides excellent heat dissipation. Indeed, the coefficient of thermal expansion for an AlSiC material is about 8.75 ppm/° C., which matches or closely matches the range of CTE values for WBG and Si integrated circuits 12 and the CTE values for the first and second electrically-insulating, thermally-conductive substrates 23 and 26.

Figure 2:
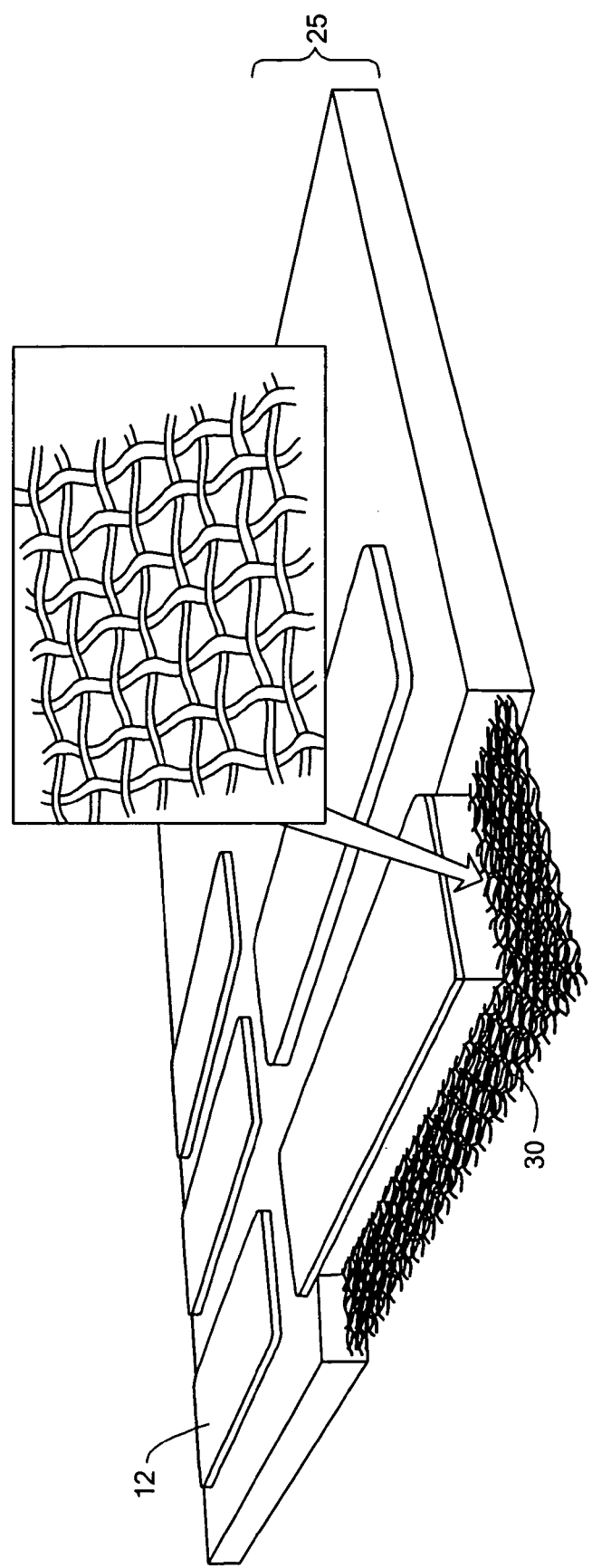
FIG. 2 is an isometric view of a single-cast MMC composite suitable for use as a MMC substrate.

A single-cast graphite-metal or MMC composite suitable for use as a MMC substrate 25 is shown in FIG. 2. The single-cast composite is formed by overcasting a three-dimensional (3-D) carbon skeletal structure 30 with molten metal. More specifically, a 3-D carbon skeletal structure 30 is structured and arrange to provide high carbon fiber oriented for xy-plane stiffness and CTE in the plane of the skeletal structure 30 and high k-Carbon fiber oriented for orthogonal, z-direction thermal conductivity. Once the 3-D carbon skeletal composite 30 is so arranged, a conductive metal 35 in a molten form, e.g., aluminum, copper, and similar conductive metals, the dielectric material comprising the second, electrically-insulating, thermally-conductive substrate 26, and other suitable conductive metals, can be cast around the 3-D carbon skeletal composite 30.

Figure 3B:
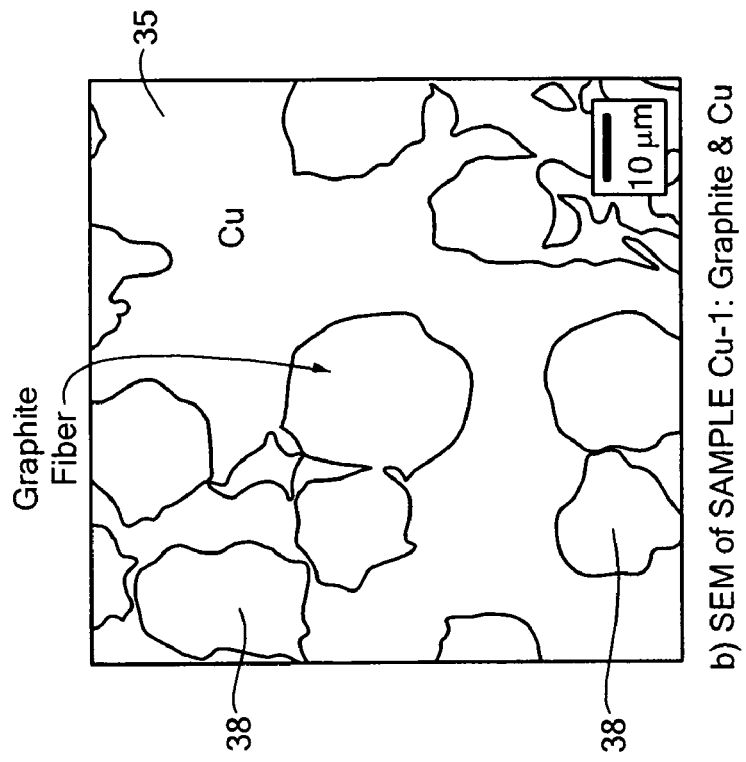
FIG. 3B is an SEM image of a cast graphite metal matrix comprising a plurality of graphite fibers surrounded by an copper metal mesh.
Figure 3A:
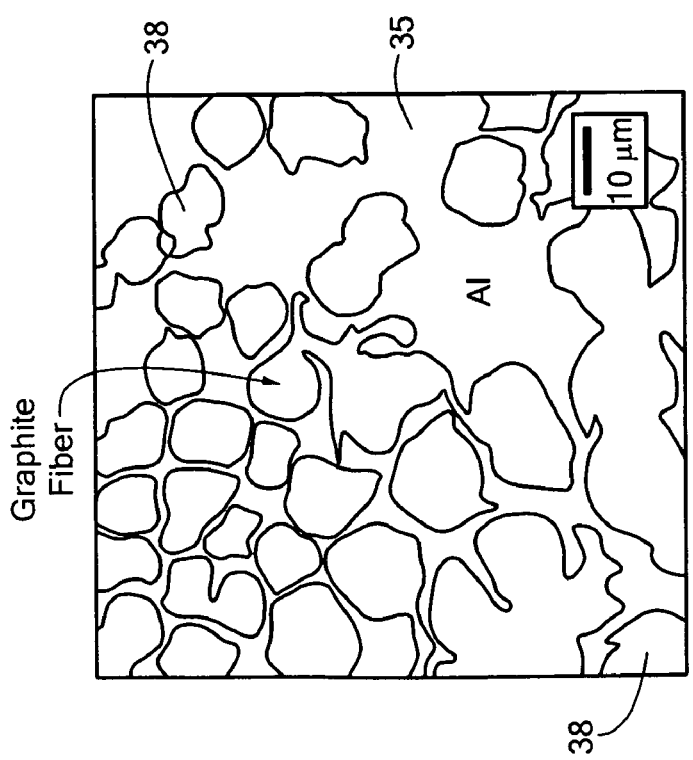
FIG. 3A is an SEM image of a cast graphite metal matrix comprising a plurality of graphite fibers surrounded by an aluminum metal mesh.

FIGS. 3A and 3B provide electron microscope (SEM) images of as-cast graphite-metal composites in a plane perpendicular to the fiber axis. In FIGS. 3A and 3B, random graphite fibers 38 are shown surrounded by a metal matrix 35. The metal matrix in FIG. 3A is aluminum and the metal matrix in FIG. 3B is copper.

Figure 4:
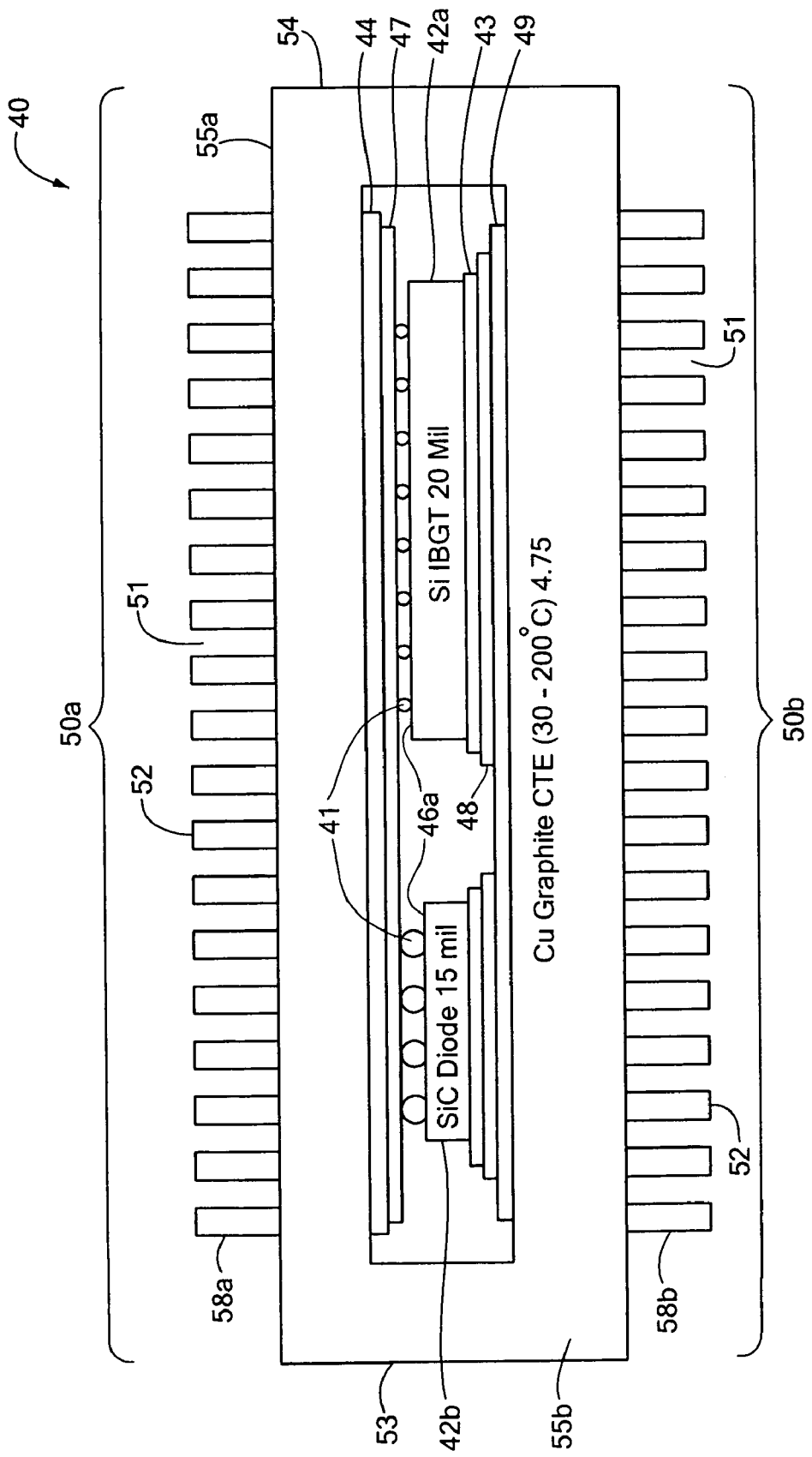
FIG. 4 is a cross sectional schematic view of a double-sided package in accord with the present invention.
Figure 5:
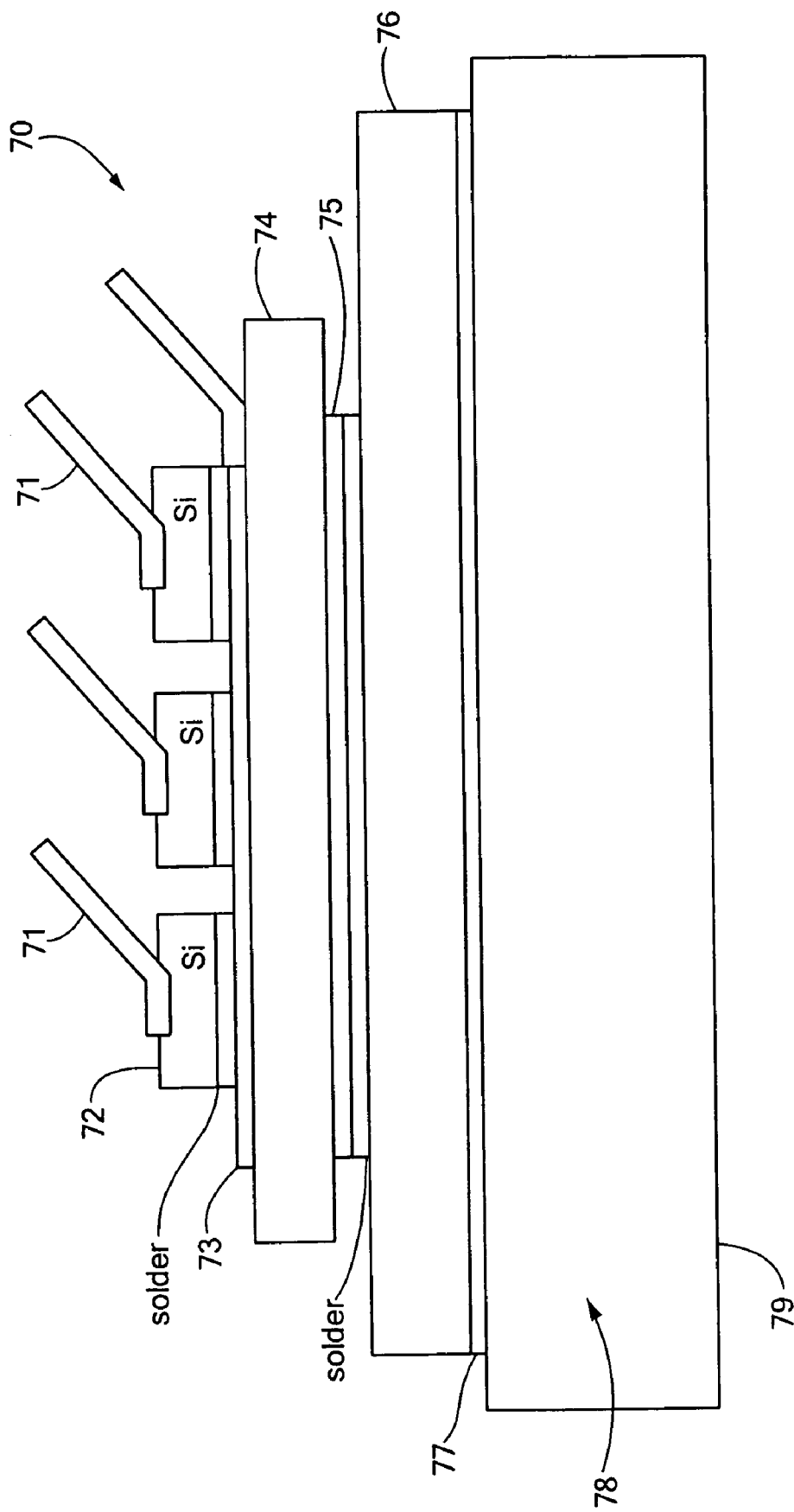
FIG. 5 is an elevation view of a conventional integrated circuit package module in accordance with the prior art.

Optionally, a double-sided module package 40 can include heat sinks 50 on opposing sides 16a and 16b of the integrated circuits 12. Such an arrangement is illustrated in FIG. 4.

With the module package 40 of FIG. 4, two cold plate assemblies or heat sinks 50a and 50b are provided, respectively, above and below the electronic semiconductor devices 42a and 42b. Side heat sink assemblies 53 and 54 surround the electronic semiconductor devices 42a and 42b, to provide all-around heat removal in the plane of the section.

For illustrative purposes only, the electronic semiconductor devices are shown as a Si IBGT 42a and a SiC diode 42b. As described above, each of the electronic semiconductor components 42a and 42b includes a plurality of bumps 41 on the lower surface 46a of the electronic devices 42a and 42b. Each of the bumps 41 is made of a conductive material, such as gold, silver, platinum, and other suitable conductors. Each bump 47 is affixed-to an electrically-conductive wiring pattern 47.

Each of the cold plate assemblies 50a and 50b includes graphite-metal or MMC substrates 55a or 55b and fin array structures 58a or 58b as previously described. The MMC substrates 55a or 55b and the fin array structures 58a or 58 b are made of a high thermally-conductive material, such as graphite, copper-graphite, and other suitable electrically-insulative and thermally-conductive materials.

An arrangement of a high thermally-conductive MMC 55a and 55b and graphite-metal fin array structure 58a and 58b provides excellent heat removal. The coefficient of thermal expansion for a copper-graphite material is about 4.75 parts ppm/° C., which matches or closely matches the range of CTE values for WBG (such as SiC) and Si integrated circuits 42a and 42b and the electrically-insulating, thermally-conductive substrates 47 and 49.

The invention has been described in detail including the preferred embodiments thereof. However, those skilled in the art, upon considering the present disclosure, may make modifications and improvements within the spirit and scope of the invention.

What is claimed is:

1. An electronic semiconductor package comprising:
at least one electronic semiconductor device, which is manufactured from a semiconductor material consisting essentially of a wide band gap semiconductor, having first and second opposing sides, said second side of said at least one electronic, wide band gap semiconductor device having a plurality of electrical contact elements;
a first layer having first and second opposing sides, said first layer including a first electrically insulating and thermally conductive substrate and a first predetermined electrically conductive wiring pattern affixed thereto, said first predetermined electrically conductive wiring pattern electrically mated to selected locations of said plurality of electrical contact elements on said second side of said at least one electronic semiconductor device;
a heat removal device that includes a graphite-metal composite portion or a metal-matrix composite portion, to remove heat from the at least one electronic semiconductor device by conduction; and
a second layer having first and second opposing sides, said second layer including a second electrically insulating and thermally conductive substrate, said first side of said second layer being thermally coupled to said heat removal device and said second side of said second layer being thermally coupled to said first side of said at least one electronic semiconductor device,
wherein the graphite-metal composite portion or the metal-matrix composite portion of the heat removal device is thermally-coupled to the second electrically-insulating, thermally-conductive substrate.

2. The electronic semiconductor package of claim 1, wherein coefficients of thermal expansion of the at least one electronic semiconductor device, the first layer, the second layer and the heat removal device are matched.

3. The electronic semiconductor package of claim 1, wherein the at least one electronic semiconductor device is manufactured of a semiconductor material that consists essentially of a wide band gap material selected from the group comprising silicon carbide (SiC), gallium nitride (GaN) or diamond.

4. The electronic semiconductor package of claim 1, wherein the first and second electrically-insulating, thermally-conductive substrates are made of a dielectric, ceramic material selected from the group comprising aluminum nitride, aluminum oxide, alumina, and berylia.

5. The electronic semiconductor package of claim 1, wherein the graphite-metal composite portion or the metal-matrix composite portion comprises thermally-anisotropic, integrated dielectric materials and graphite materials.

6. The electronic semiconductor package of claim 1, wherein dielectric material used in the second electrically-insulating, thermally-conductive substrate is included in the graphite-metal composite portion or the metal-matrix composite portion.

7. The electronic semiconductor package of claim 1, wherein the graphite-metal composite portion or the metal-matrix composite portion comprises a three-dimensional skeletal structure of graphite that is structured and arranged in a metal matrix.

8. The electronic semiconductor package of claim 7, wherein the three-dimensional skeletal structure of graphite includes high k-carbon fibers that are oriented orthogonal to an xy-plane in said metal matrix, to provide thermal conductivity in an orthogonal, z-direction with respect to the plane.

9. The electronic semiconductor package of claim 7, wherein the three-dimensional skeletal structure of graphite provides a coefficient of thermal expansion matching between material layers within the over-casting.

10. The electronic semiconductor package of claim 7, wherein the metal matrix is aluminum or copper.

11. The electronic semiconductor package of claim 1, wherein the heat removal device further includes a fin array structure that is thermally-coupled to the graphite-metal composite portion or the metal-matrix composite portion, to remove heat from said graphite-metal composite portion or metal-matrix composite portion by convection.

12. The electronic semiconductor package of claim 11, wherein the graphite-metal composite portion or the metal-matrix composite portion and the fin array structure are made of thermally-conductive materials selected from the group comprising graphite or aluminum silicon carbide.

13. The electronic semiconductor package of claim 11, wherein the fin array structure comprises a plurality of fins having a channel disposed between adjacent fins for receiving a fluid.

14. The electronic semiconductor package of claim 1, wherein said second layer has a thickness range between about 5 and about 25 mils.

15. The electronic semiconductor package of claim 1, wherein the second layer includes a second predetermined electrically conductive wiring pattern wherein selected locations on said second predetermined electrically conductive wiring pattern are electrically mated to contact elements on the first side of said at least one electronic semiconductor device.

16. The electronic semiconductor package of claim 1, further comprising a second heat removal device that is thermally-coupled to said second side of said first layer.

17. The electronic semiconductor package of claim 16, wherein said second heat removal device includes a graphite-metal composite portion or a metal-matrix composite portion that is thermally-coupled to the first electrically-insulating, thermally-conductive substrate, to remove heat from the at least one electronic semiconductor device by conduction.

18. The electronic semiconductor package of claim 17, wherein the second heat removal device further includes a fin array structure that is thermally-coupled to the graphite-metal composite portion or the metal-matrix composite portion, to remove heat from said graphite-metal composite portion or said metal-matrix composite portion by convection.

19. The electronic semiconductor package of claim 18, wherein the graphite-metal composite portion or the metal-matrix composite portion and the fin array structure are made of thermally-conductive materials selected from the group comprising graphite or aluminum silicon carbide.

* * * * *